United States Patent [19]

Jayadev et al.

[11] Patent Number: 4,588,520
[45] Date of Patent: May 13, 1986

[54] POWDER PRESSED THERMOELECTRIC MATERIALS AND METHOD OF MAKING SAME

[75] Inventors: Tumkur S. Jayadev, Rochester; On Van Nguyen, Sterling Heights; Jaime M. Reyes, Birmingham; Helen Davis, Royal Oaks; Michael W. Putty, East Detroit, all of Mich.

[73] Assignee: Energy Conversion Devices, Inc., Troy, Mich.

[21] Appl. No.: 414,917

[22] Filed: Sep. 3, 1982

[51] Int. Cl.[4] .............................................. H01B 1/06
[52] U.S. Cl. .................... 252/512; 252/514; 252/518; 252/62.3 T; 420/579; 420/580
[58] Field of Search .......... 252/512, 518, 514, 62.3 T; 75/134 D, 134 H, 149, 173 R, 255; 420/579, 501, 580, 547, 571, 577; 148/400, 4, 11.5 R, 13.1

[56] References Cited

U.S. PATENT DOCUMENTS

| | | | |
|---|---|---|---|
| 2,957,937 | 10/1960 | Jensen et al. | 252/62.3 T |
| 2,995,613 | 8/1961 | Wernick | 252/62.3 T |
| 3,228,805 | 1/1966 | Waseleski et al. | 148/400 X |
| 3,310,493 | 3/1967 | Rupprecht | 252/62.3 T |
| 3,414,405 | 12/1968 | Fisher | 148/400 X |
| 4,177,473 | 12/1979 | Ovshinsky | 357/2 |
| 4,177,474 | 12/1979 | Ovshinsky | 357/2 |
| 4,178,415 | 12/1979 | Ovshinsky et al. | 252/512 X |
| 4,447,277 | 5/1984 | Jayadev | 148/400 |

*Primary Examiner*—Josephine L. Barr
*Attorney, Agent, or Firm*—Richard M. Goldman; Lawrence G. Norris; Richard O. Gray

[57] ABSTRACT

New and improved compacted or powder pressed materials for thermoelectric applications include a body formed from compacted powder material including at least bismuth and tellurium and at least one highly electrically conductive phase. The materials are made in accordance with the general method of the present invention by forming a particulate mixture containing the constituent elements of a first compound including at least bismuth and tellurium and the constituent elements of a second compound capable of forming at least one highly electrically conductive phase, and thereafter, compressing at least a portion of said particulate mixture to form a compacted body of the material. In accordance with a first preferred embodiment, the first and second compounds are first separately prepared from their respective constituent elements. The first and second compounds are then combined and heated to form a melt. Thereafter, the melt is cooled to solid material form and then crushed to form the particulate mixture. In accordance with a second preferred embodiment, a melt is first formed from the second compound and the constituent elements of the first compound. The melt is then cooled to solid material form and then crushed to form the particulate mixture. In accordance with a further embodiment of the present invention, the first and second compounds are first separately prepared from their respective constituent elements and then separately crushed into particulate form prior to forming the particulate mixture.

5 Claims, 21 Drawing Figures

POWDER PRESSED THERMOELECTRIC MATERIALS AND METHOD OF MAKING SAME

BACKGROUND

The present invention relates to new and improved powder pressed materials for thermoelectric applications and a method for making the same.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new materials for use in devices which provide more electricity.

An important part of the solution with respect to the development of permanent, economical energy conversion lies in the field of thermoelectrics wherein electrical power is generated by heat. It has been estimated that two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of the polar ice caps with an attendant increase in sea level. Employment of the waste heat for the regeneration of electricity can provide a direct reduction in the thermal pollution, independent of the source of the energy.

The performance of a thermoelectric device can be expressed in terms of a figure of merit (Z) for the material forming the device, wherein Z is defined as:

$$Z = \frac{S^2 \sigma}{K}$$

where:

Z is expressed in units x $10^3$
S is the Seebeck coefficient in $\mu V/°C$.
K is the thermal conductivity in mW/cm−°K.
$\sigma$ is the electrical conductivity in $(\Omega\text{-cm})^{-1}$ From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K): $K_l$, the lattice component; and $K_e$, the electrical component. In non-metals, $K_l$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Those crystalline materials best suited for thermoelectric devices are very difficult to manufacture because of poor mechanical properties and sensitivity of material properties to compositional changes. This results because they contain a predominance of elements, such as tellurium, and selenium which are natural glass formers. The growth, control, and mechanical stability of these crystals have, therefore, led to what to this date are insurmountable problems. In particular, the materials having a high figure of merit (Z) are generally made from chalcogenides such as tellurium compounds which are notorious for the difficulties in growth of high quality single crystals. Even when such crystals are grown, they contain large densities of defects and are often unstable. In addition, they usually are far from stoichiometric. For all of these reasons, controlled doping has proven to be extremely difficult.

Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems are especially difficult.

Among the best known currently existing polycrystalline thermoelectric materials are (Bi, Sb)$_2$Te$_3$, PbTe, and Si-Ge. The (Bi, Sb)$_2$Te$_3$ represents a continuous solid solution system in which the relative amounts of Bi and Sb are 0 to 100%. The Si-Ge materials are best suited for high temperature applications in the 600° to 1000° C. range with a satisfactory Z appearing at above 700° C. The PbTe polycrystalline material exhibits its best figure of merit in the 300° to 500° C. range. None of these materials is well suited for applications in the 100° C. to 300° C. range. This is indeed unfortunate, because it is in this temperature range where a wide variety of waste heat applications are found. Among such applications are geothermal waste heat and waste heat from internal combustion or diesel engines in, for example, trucks, buses, and automobiles. Applications of this kind are important because the heat is truly waste heat. Heat in the higher temperature ranges must be intentionally generated with other fuels and therefore is not truly waste heat.

Improved thermoelectric materials have been developed which are not single phase crystalline materials, but instead, are disordered materials. These materials, fully disclosed in U.S. application Ser. No. 341,864, filed Jan. 22, 1982 in the names of Tumkur S. Jayadev and On Van Nguyen for New Multiphase Thermoelectric Alloys and Method of Making Same, now abandoned in favor of U.S. Ser. No. 412,306 filed Aug. 27, 1982 and to issue May 8, 1984 as U.S. Pat. No. 4,447,277, and incorporated herein by reference, are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction. Contrary to conventional materials these materials have grain boundaries defining regions including conductive phases therein providing numerous electrical conduction paths through the bulk material for increasing electrical conductivity without substantially effecting the thermal conductivity. In essence, the materials have all of the advantages of polycrystalline materials in desirably low thermal conductivities and crystalline bulk Seebeck properties. However, unlike the prior art polycrystalline materials, these disordered multiphase materials also have desirably high electrical conductivities. Hence, as disclosed in the aforementioned referenced application, the $S^2\sigma$ product for the figure of merit of these materials can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pat. Nos. 4,177,473, 4,177,474 and 4,178,415 which issued in the name of Stanford R. Ovshinsky. The materials disclosed in these patents are formed in a solid amorphous host matrix having structural configurations which have local rather than longrange order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the heretofor mentioned independently increased electrical conductivities. In contrast, the materials of U.S. Pat. No. 4,447,277 are not atomically modified. Rather, they are fabricated in a manner which introduces disorder into the material on a macroscopic level. This disorder allows various phases including conductive phases to be introduced into the materials much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

The materials of the present invention can be produced from materials by methods embodying the present invention which have the same structural characteristics as the materials disclosed and claimed in the aforementioned and referenced U.S. Pat. No. 4,447,277. The materials of the present invention however include a form of bulk disorder not present in the materials disclosed in the aforementioned application. This additional disorder results from the fact that the materials of the present invention are in the form of compacted or pressed powder material. While the individual powder particles from which the compacted material is formed can have the desirable disordered structure as previously described, the additional disorder resides in the interfaces between the compacted particles. Although this additional disorder results in lower electrical conductivity, the thermal conductivity is also lowered to an extent to provide a figure of merit which is acceptable for commercial applications, especially in the temperature range up to about 400° C. In fact, the figure of merit of these materials is greater than the figure of merit of the conventional prior art polycrystalline materials above about 200° C.

In addition to the foregoing, the materials of the present invention can be compacted or pressed into solid form with dimensions suitable for direct application as thermoelectric elements for thermoelectric devices. Also, the elements can be formed at commercially acceptable high rates to sustain high volume mass production of thermoelectric devices. This is not possible with conventional polycrystalline materials which must be grown over long periods of time and under precisely controlled growing conditions.

SUMMARY OF THE INVENTION

The present invention provides new and improved compacted or pressed powder materials for thermoelectric applications. The materials have commercially high figures of merit in desired temperature ranges. The present invention also provides a method for making the materials. The powder particles from which the new and improved materials are formed can, when produced in accordance with preferred embodiments of the method of the present invention, have compositional disorder, translational disorder, configurational disorder, and other disorders introduced therein. These powder materials are multiphase alloy materials having a first phase including matrix crystallites bounded by disordered grain boundaries of various phases including transitional phases. Between the grain boundaries are macroscopic grain boundary regions which also include various phases including electrically conductive phases and crystalline inclusions. The grain boundary regions are rich in electrically conducting modifying phases which provide high electrical conductivities. The other phases in the grain boundary regions and the grain boundaries provide low thermal conductivities. The compacted materials further include additional bulk disorder between the interfaces of the compacted powder particles which further reduces the thermal conductivity. The materials comprise a body formed from compacted powder material. The compacted material preferably includes bismuth and tellurium and at least one highly electrically conductive phase.

The materials are made in accordance with the general method of the present invention by forming a particulate mixture containing the constituent elements of a first compound including at least bismuth and tellurium and the constituent elements of a second compound capable of forming at least one highly electrically conductive phase, and thereafter, compressing at least a portion of said particulate mixture to form a compacted body of the material.

In accordance with a first preferred embodiment, the first and second compounds are first separately prepared from their respective constituent elements. The first and second compounds are then combined and heated to form a melt. Thereafter, the melt is cooled to solid material form and then crushed to form the particulate mixture.

In accordance with a second preferred embodiment, a melt is first formed from the second compound and the constituent elements of the first compound. The melt is then cooled to solid material form and then crushed to form the particulate mixture.

In accordance with a further embodiment of the present invention, the first and second compounds are first separately prepared from their respective constituent elements and then separately crushed into particulate form prior to forming the particulate mixture.

Preferably, the first compound includes bismuth, antimony, and tellurium for making a p-type material and bismuth, tellurium, and selenium for making an n-type material. The second compound, to be combined with either of these first compounds, preferably includes silver, antimony, and tellurium.

DETAILED DESCRIPTION

Figure 1:
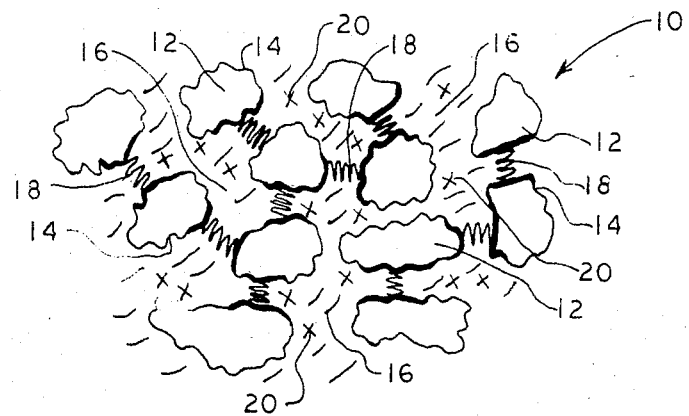
FIG. 1 is a fragmental cross-sectional view illustrating the structure of a powder particle from which the material of the present invention is formed when made in accordance with a preferred embodiment of the method of the present invention.

The present invention provides a method of making compacted or pressed powder thermoelectric materials having commercially high figures of merit (Z) over desired temperature ranges for many applications. The powder particles from which the materials of the present invention are formed can have the disorder of the materials disclosed in the referenced U.S. Pat. No. 4,447,277 when made in accordance with first and second preferred embodiments of the method of the present invention. The disorder is not only in how the elements combine in their different phases in an atomic manner, but is also in macroscopic form wherein the materials have compositional disorder, translational disorder, configurational disorder or other disorders such as surface disorders as well as transitional phases on their surfaces between the phases which allow the creation of unique electrical conduction paths throughout the bulk of the material providing increased electrical conductivity while the disorder provides low thermal conductivity. The particles from which the materials of the present invention are formed have, like the materials disclosed in the referenced application, three dimensional disorder having a multiplicity of matrix crystallites separated by multiphase grain boundary regions and disordered grain boundaries. The grain boundary regions include highly electrically conductive modifying phases creating numerous interstitial conduction paths between crystallites throughout the particles affording control of the paths and thus the electrical conductivity whereas typical crystalline structures have overall bulk conductivity properties not easily changed. The materials of the present invention have additional bulk disorder. This additional bulk disorder resides in the interfaces between the compacted powder particles and provides decreased thermal conductivity.

Disorder in thermoelectric materials can be of varying degrees. Single phase crystalline materials, of course, can afford little disorder and therefore have substantially fixed parameters. Pure amorphous materials have no long range order at all and can be modified in a manner as previously described. The powder particles from which the materials of the present invention are formed, when made in accordance with the first and second embodiments of the method of the present invention, are multiphase in structure having substantially more disorder than the crystalline materials of the prior art and have varying degrees of order and disorder inherent in them. The disorder may be the result of compositional disorder wherein a structure becomes disordered by the combining of elements in a manner which changes the elemental distributions in the material from that which would naturally occur. Compositional disorder, for example, is identified in the powder particles by phases within the materials such as, by the presence of crystallites, disordered grain boundaries including transitional phases, and grain boundary regions containing varying complexes and phases of constituent elements.

Translational disorder in the powder particles is evident because the crystallites, grain boundaries and grain boundary regions are arranged at random. The crystallites are of varying sizes and orientations while the grain boundaries are of varying width and length dimensions. Configurational disorder is present in the powder particles because the crystallites are of varying shapes having random and irregular surface configurations. The grain boundaries also randomly vary in configuration.

All of the above result in powder particles which are very disordered accounting for the desirable low thermal conductivities while the highly conductive phases within the grain boundary regions form unique conduction paths between crystallites to provide high electrical conductivities. Electrically conductive paths are provided in the entire volume of the particles which greatly increase the electrical conductivity while the thermal conductivity remains unaffected and even is desirably decreased. This result is not possible with crystalline materials. As a result, even though the alloy materials of the present invention are formed from pressed powder which would normally decrease electrical conductivity and thus the figure of merit of the material below acceptable limits, the materials of the present invention maintain sufficiently high figures of merit to render them suitable for commercial applications.

As previously mentioned, the electrical conductivity of a material is ordinarily proportional to thermal conductivity. This holds true especially for crystalline materials. With such materials, it is extremely difficult to increase electrical conductivity without concomitantly increasing thermal conductivity. Since however, thermal conductivity is much more dependent on the long range atomic environment than electrical conductivity, disordered materials can attain large values of electrical conductivity while maintaining low thermal conductivities. Another important point is that since stoichiometry and purity are not factors in these materials as in conventional materials, a much greater latitude for manufacturing and lifetime stability are possible. These materials are enhanced or unaffected by disorder unlike prior crystalline or polycrystalline materials.

Another advantage of disordered materials, is that they are more flexible than crystalline materials. The disordered material is thus capable of more distortion during expansion and contraction allowing for greater mechanical stability during heating and cooling cycles of the material.

In general, and in accordance with the broader aspects of the present invention, the method of making the improved powder pressed thermoelectric materials of the invention is practiced by forming a particulate mixture containing the constituent elements of a first compound, including at least bismuth and tellurium, and the constituent elements of a second compound, capable of forming at least one highly electrically conductive phase. Thereafter, at least a portion of the particulate mixture is compressed to form the new and improved thermoelectric material of the present invention in the form of a compacted body of pressed powder material.

To achieve the desired disorder as previously described in the particles of the particulate mixture from which the material is formed, a melt containing the first and second compounds in appropriate proportion is first formed and then cooled to solid form. The solid form material is then crushed to form the particulate mixture. The first and second compounds can be separately prepared from their respective constituent elements prior to forming the melt. Alternatively, in accordance with a second preferred embodiment of the invention, the melt can be formed by combining the second compound with the individual constituent elements of the first compound. This eliminates the need to separately prepare the first compound.

For making p-type material, the first compound preferably includes bismuth, antimony, and tellurium in the proportions of ten percent (10%) bismuth, thirty percent (30%) antimony, and sixty percent (60%) tellurium. A small amount of dopant, for example about 0.15 weight-percent of tellurium iodide ($TeI_4$) can also be included in or with the compound.

For making n-type material, the first compound preferably includes bismuth, tellurium, and selenium in the proportions of forty percent (40%) bismuth, forty-two percent (42%) to fifty-four percent (54%) tellurium, and eighteen percent (18%) to six percent (6%) selenium. A small amount of dopant, for example about 0.1 to 0.2 weight-percent cadmium chloride ($CdCl_2$) or tellurium iodide (TeI$_4$) can also be included in or with the compound.

For making either the p-type or n-type material, the second compound preferably includes silver, antimony, and tellurium in the proportions of twenty-five percent (25%) silver, twenty-five percent (25%) antimony, and fifty percent (50%) tellurium. This compound, AgSbTe$_2$, when combined with either of the above-mentioned first compounds in a melt, form after cooling, many highly electrically conductive phases within the material. Among these phases, silver-tellurium phases are most notable.

The first and second compounds are combined in the proportions of about 99.6% to 97% of the first compound to 0.4% to 3% of the second compound. As will be noted from the specific examples disclosed hereinafter, desired thermoelectric material characteristics can be obtained over desired temperature ranges by varying the respective proportions of the first and second compounds.

The first and second compounds exhibit different crystalline structure or geometries to promote and facilitate the disordered structure within the particles of the resulting thermoelectric alloy material. The disorder which results is exemplified by matrix crystallites, principally of the first compound, bordered by disordered grain boundaries containing transitional phases, and grain boundary regions between the grain boundaries exhibiting a multiplicity of phases having significantly different electrical and thermal properties. For example, the first compound has a rhombohedral crystalline structure and the second compound has a face centered cubic crystalline structure.

The second compound, when combined with either of the first compounds, in relatively minor amounts or proportions, modifies the electrical and thermal properties of the first compounds to result in a thermoelectric material having a higher electrical conductivity than the first compound alone and/or a lower thermal conductivity than the first compound alone.

To modify the electrical conductivity, the second compound when combined with the first compound forms a highly conductive phase or phases in the grain boundary regions. When the second compound is combined with the first compound, a significant amount of the antimony of the second compound enters the bulk of the first compound leaving behind, in the grain boundary regions, highly electrically conductive complexes of the silver and tellurium. These complexes represent phases which are rich in silver.

The material which results, and from which the powder particles are formed and later pressed into the improved compacted or pressed powder thermoelectric material of the present invention, has very good thermoelectric characteristics. This material exhibits a good Seebeck coefficient, low thermal conductivity, and high electrical conductivity. Even though when material is crushed and pressed the electrical conductivity normally decreases, the electrical conductivity of these materials is so initially high that even after pressing, the resulting compacted material still exhibits commercially acceptable electrical conductivities. Furthermore, after pressing, the resulting material exhibits a decreased thermal conductivity and essentially the same Seebeck coefficient. As a result, a final material results which exhibits commercially sufficient figures of merit for many applications.

The structure of a powder particle from which the materials of the present invention are formed in accordance with the foregoing is illustrated in FIG. 1, which is not drawn to scale to enable a more detailed representation of the material.

As previously mentioned, the alloy material 10 of the particles includes a multiplicity of matrix crystallites 12. The crystallites are separated by disordered grain boundaries 14 and grain boundary regions 16. The grain boundaries 14 include transitional phases between the crystallites 12 and the grain boundary regions 16. These transitional phases vary in composition from the composition of the matrix crystallites to the composition of the various phases in the grain boundary regions. The grain boundary regions 16 include various phases some of which being rich in silver forming highly conductive modifying phases 18 and even microcrystalline inclusions 20. The matrix crystallites 12 generally have width dimensions on the order of 10 microns and the grain boundary regions 16 are macroscopic in size varying from 0.1 to three microns.

EXAMPLES 1–4

The n-type materials of Examples 1–4 have the general compositions of:

(0.2 w/o TeI$_4$ doped Bi$_{40}$Te$_{48}$Se$_{12}$)$_{1-x}$ + (Ag$_{25}$Sb$_{25}$Te$_{50}$)$_x$ where x equals 0.005, 0.01, 0.02, and 0.03.

These materials were prepared in accordance with a first preferred embodiment of the present invention in the following manner. The first compound (0.2 w/o TeI$_4$ doped Bi$_{40}$Te$_{48}$Se$_{12}$) and the second compound (Ag$_{25}$Sb$_{25}$Te$_{50}$) were separately prepared by forming a melt from their respective constituent elements in the indicated proportions and thereafter cooled to solid form. The compounds were then crushed and mixed together in proportions corresponding to x being equal to 0.005, 0.01, 0.02, and 0.03. Each of the four mixtures was heated at 800° C. for several hours to form a melt and then cooled to solid form. The materials were then crushed, ground, and sieved through a standard mesh to provide a particulate mixture having powder particles of less than one hundred microns (100 μm) in dimension. The powders were then pressed or compacted under a pressure of 15 tons per square centimeter to form compacted bodies or elements 1.27 centimeters in diameter and 3 millimeters thick. The elements were then sintered at 400° C. for about two hours in a vacuum (an inert gas atmosphere could also be used).

The room temperature Seebeck coefficients for these materials are listed below:

| X | S |
|---|---|
| 0 | 110 |
| .005 | 140 |
| .01 | 155 |
| .02 | 170 |
| .03 | 180 |

From the above, it will be noted that the room temperature Seebeck coefficients increase with increasing concentrations of the second compound. It can also be noted that the Seebeck coefficient for all of the alloyed materials is higher than the non-alloyed material which is a conventional, prior art material.

Figure 2:
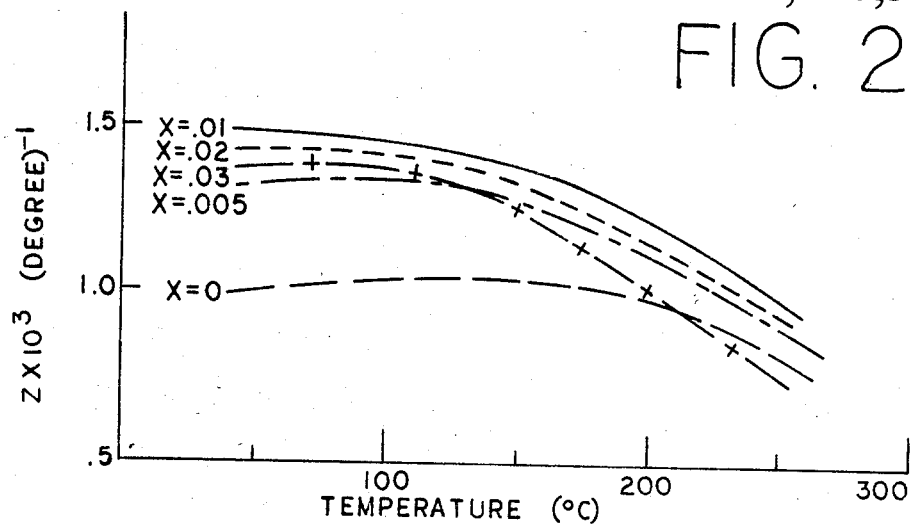
FIG. 2 is a graph illustrating the figure of merit (Z) versus temperature for various n-type alloy materials of the present invention made in accordance with a first preferred embodiment of the method of the present invention.
Figure 3:
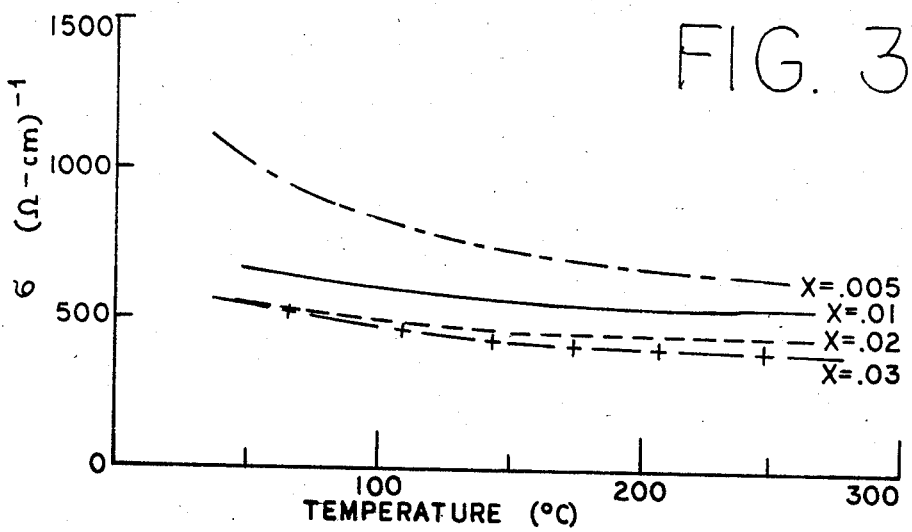
FIG. 3 is a graph illustrating electrical conductivity ($\sigma$) versus temperature for the alloy materials of FIG. 2.

FIGS. 2 and 3 illustrate the figure of merit (Z) and electrical conductivity ($\sigma$) respectively versus temperature for each of these materials. FIG. 2 reveals that the figure of merit of all of the alloyed materials is better than the conventional pressed material up to about 220° C. Above about 220° C., the figure of merit of the conventional pressed material is higher than only the one alloy material where x=0.03. The material where x=0.01 has the highest figure of merit over the entire displayed temperature range.

EXAMPLES 5-8

The materials of Examples 5-8 were formed from powder particles having the same composition of (0.2 w/oTeI$_4$ doped Bi$_{40}$Te$_{48}$Se$_{12}$)$_{0.99}$+(Ag$_{25}$Sb$_{25}$Te$_{50}$)$_{0.01}$ and were pressed or compacted under different pressures of 6.3, 9.5, 12, and 16 tons per square centimeter respectively. The powder was prepared in accordance with the first preferred embodiment described with respect to Examples 1-4.

Figure 4:
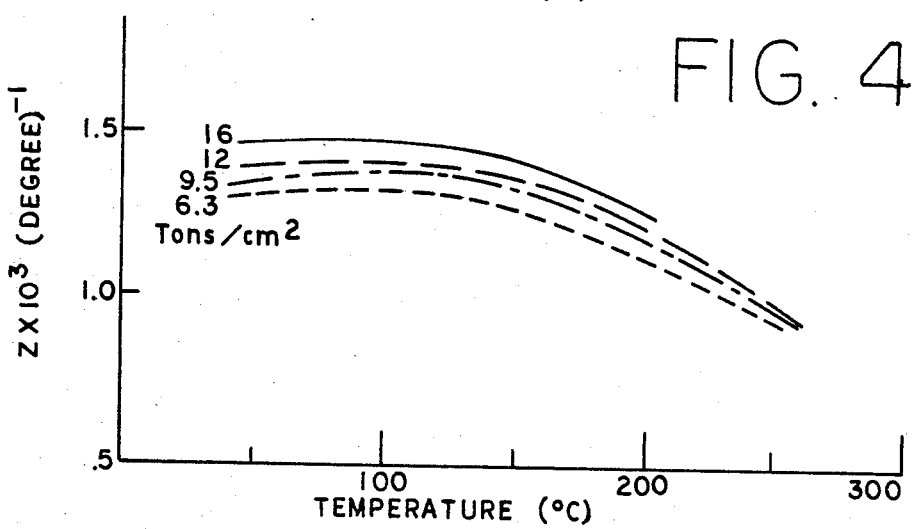
FIG. 4 is a graph illustrating the figure of merit (Z) versus temperature for various alloy materials of the present invention having the same composition but which were pressed at various pressures.
Figure 5:
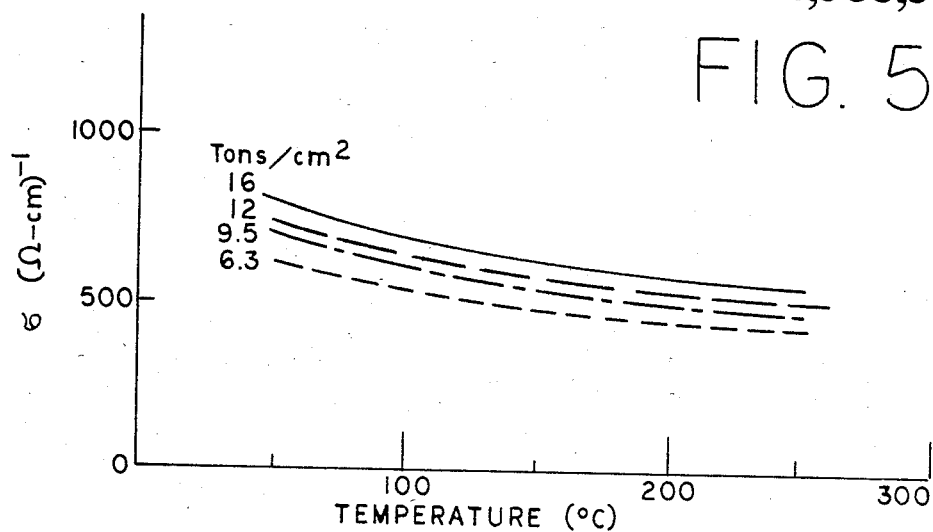
FIG. 5 is a graph illustrating the electrical conductivity ($\sigma$) versus temperature for the alloy materials of FIG. 4 pressed at various pressures.
Figure 6:
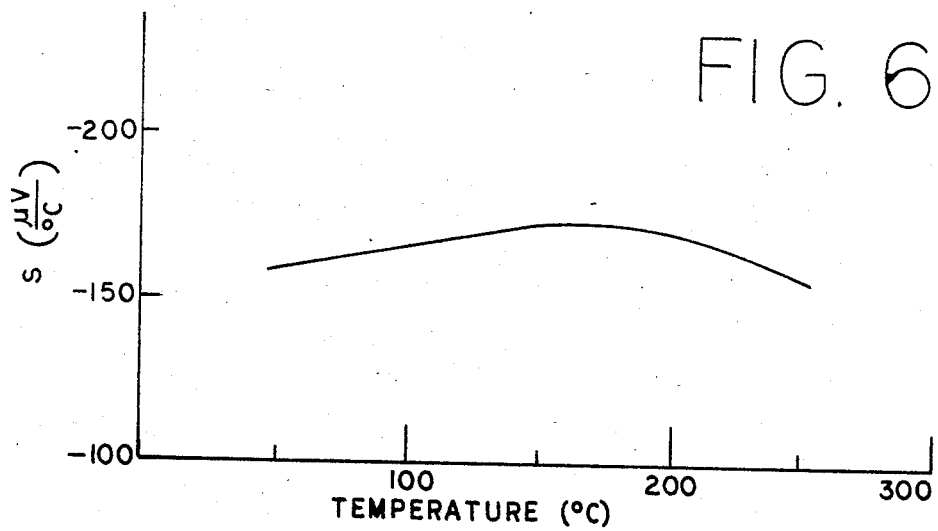
FIG. 6 is a graph of the Seebeck coefficient versus temperature for the alloy materials of FIG. 4 pressed at various pressures.

FIGS. 4, 5, and 6 illustrate the figure of merit (Z), electrical conductivity ($\sigma$), and Seebeck coefficient (S) respectively versus temperature for these materials. It can be noted from FIGS. 4 and 5 that as the pressing pressure is increased, the materials correspondingly exhibit increased figure of merit and electrical conductivity. However, the figures of merit are about the same for all of the materials at temperatures above 200° C. FIG. 6 illustrates that the Seebeck coefficient is independent of pressing pressure for this composition and is maximum at about 200° C.

EXAMPLES 9-13

These materials had the same composition and were prepared in the same manner as the materials of Examples 5-8. However, each of these materials were formed from powder particles having sizes in the distinct ranges of: A, 106 to 150 $\mu$m; C, 75 to 106 $\mu$m; E, 45 to 75 $\mu$m; G, 38 to 45 $\mu$m; and I, less than 38 $\mu$m. They were all pressed under the same pressure of 15 tons per square centimeter.

Figure 7:
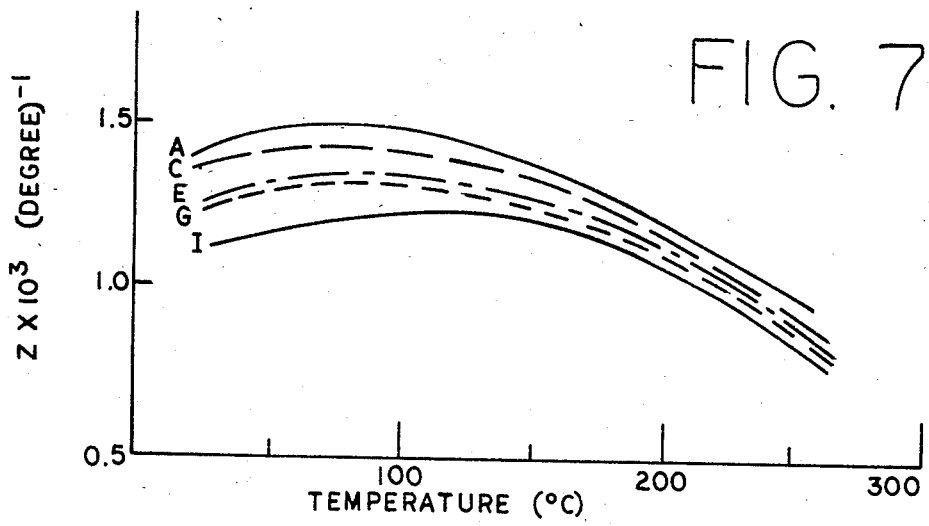
FIG. 7 is a graph illustrating the figure of merit (Z) versus temperature for various alloy materials of the present invention having the same composition but which were formed from various particle sizes.
Figure 8:
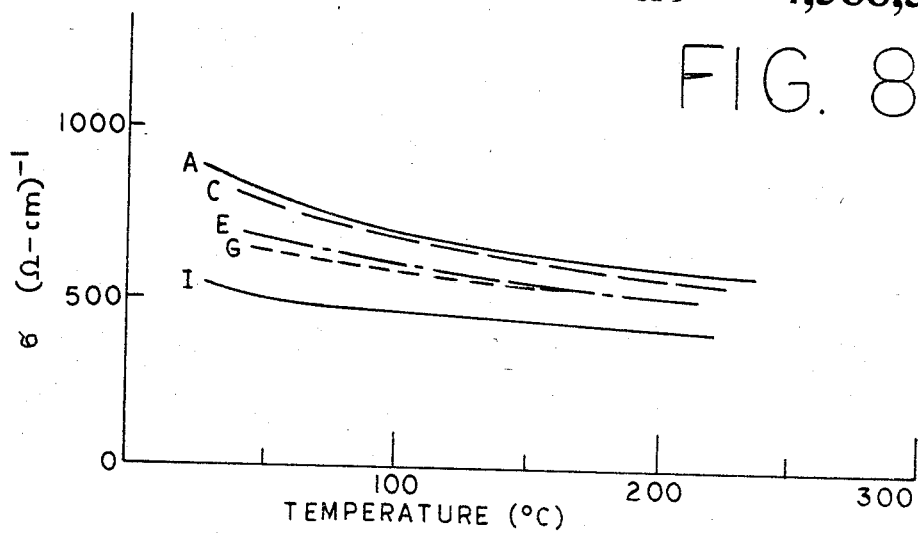
FIG. 8 is a graph illustrating the electrical conductivity ($\sigma$) versus temperature for the alloy materials of FIG. 7 formed from various particle sizes.

FIGS. 7 and 8 illustrate the figure of merit (Z) and electrical conductivity ($\sigma$) respectively versus temperature for these materials. It can be noted from FIGS. 7 and 8 that as the particle size increases, the figure of merit and electrical conductivity also increases. The room temperature Seebeck coefficients of these materials were the same and were about 160.

Figure 9:
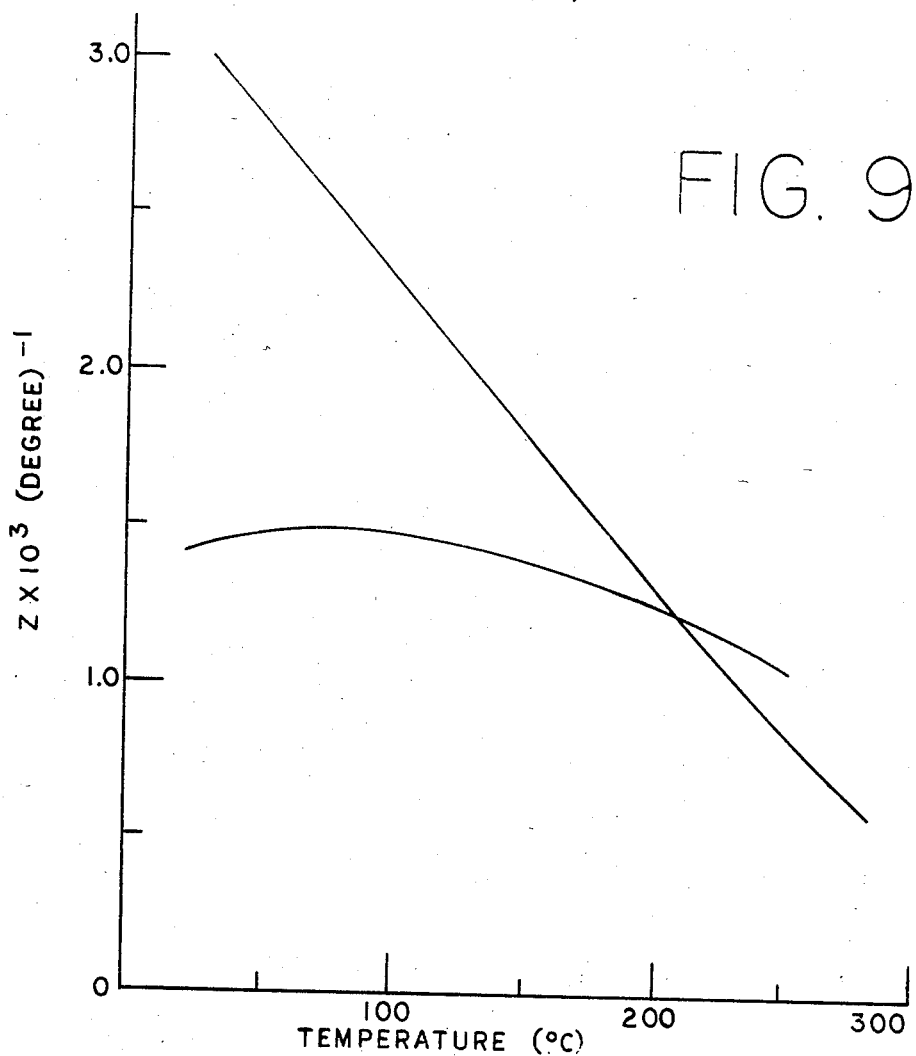
FIG. 9 is a graph illustrating the figure of merit (Z) versus temperature for a conventional grown polycrystalline thermoelectric material and an alloy material of the present invention.

FIG. 9 illustrates the figure of merit (Z) versus temperature for the material of the present invention having the composition (0.2 w/oTeI$_4$ doped Bi$_{40}$Te$_{48}$Se$_{12}$)$_{0.99}$+(Ag$_{25}$Sb$_{25}$Te$_{50}$)$_{0.01}$ and the conventional grown polycrystalline n-type material having the composition Bi$_{40}$Te$_{54}$Se$_6$. The material of the invention was prepared in accordance with the first embodiment of the invention described with respect to Examples 1-4.

It can be noted that the figure of merit of the pressed material of the invention is greater than the figure of merit of the conventional material above about 200° C. This is significant because most commercial applications are at temperatures above 200° C. Also, the difference is even more pronounced when considering the product of figure of merit and temperature (ZT) versus temperature. This is also significant because the product of ZT is directly proportional to the efficiency of a material in converting a temperature differential into electrical energy.

EXAMPLE 14

Figure 10:
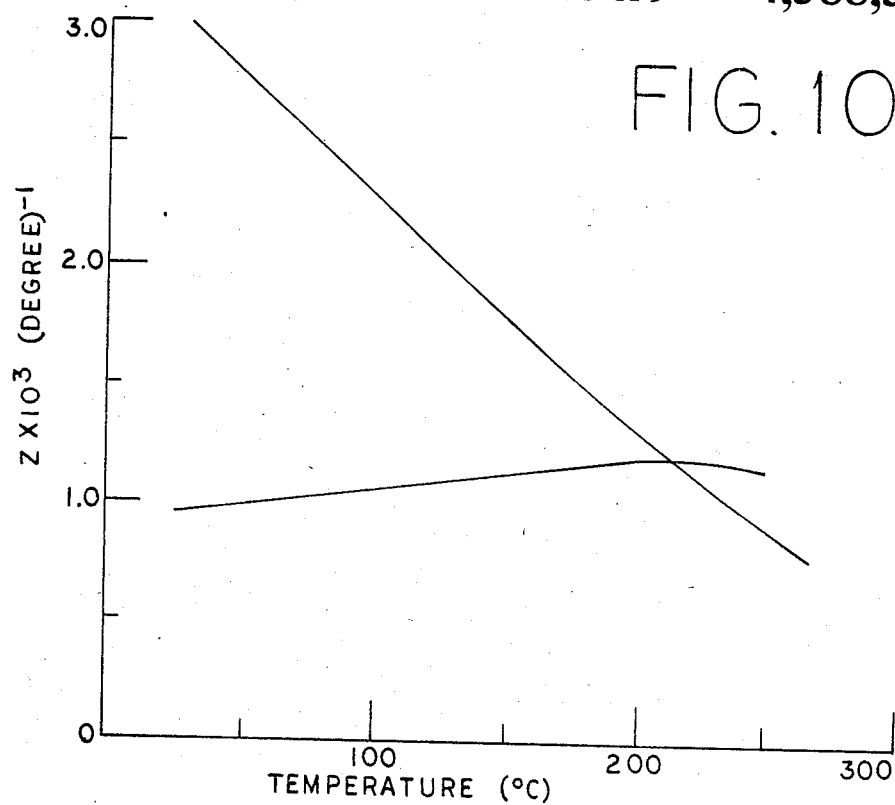
FIG. 10 is a graph illustrating the figure of merit (Z) versus temperature for the conventional grown polycrystalline thermoelectric material and another alloy material of the present invention.

The n-type material of this Example 14 had the composition (0.4 w/oTeI$_4$ doped Bi$_{40}$Te$_{42}$Se$_{18}$)$_{0.99}$+(Ag$_{25}$Sb$_{25}$Te$_{50}$)$_{0.01}$ and was prepared in the same manner as the materials of Examples 1-4 in accordance with the first preferred embodiment of the method of the present invention. The material was pressed at a pressure of 16 tons per square centimeter and the particles where less than 150 microns in dimension. FIG. 10 illustrates the figure of merit (Z) versus temperature for this material and the conventional polycrystalline n-type material. Again it can be noted that the figure of merit of this material is greater than the conventional material above about 210° C. and significantly greater at 250° C.

EXAMPLE 15

The material of Example 15 is a p-type material having the compositons of (0.15 w/oTeI$_4$ doped Bi$_{10}$Sb$_{30}$Te$_{60}$)$_{0.99}$+(Ag$_{25}$Sb$_{25}$Te$_{50}$)$_{0.01}$. The material was prepared in accordance with the first embodiment of the present invention. To that end, the first compound (0.15 w/oTeI$_4$ doped Bi$_{10}$Sb$_{30}$Te$_{60}$) and second compound (Ag$_{25}$Sb$_{25}$Te$_{50}$) were separately prepared by forming a melt from their respective constituent elements in the indicated proportions and thereafter cooled to solid form. The compounds were then separately crushed.

A particulate mixture of 99% of the first compound and 1% of the second compound was formed and then melted. After cooling, the material was crushed and ground to a particle size of between 100 and 150 microns to form the particulate mixture. At least a portion of the powder was placed into a stainless steel die and pressed at a pressure of 12 tons per square centimeter. Compacted bodies or elements were thus formed having dimensions of 1.27 centimeters in diameter and 3 millimeters in thickness. The elements were thereafter sintered at about 400° C. for about two hours.

Figure 11:
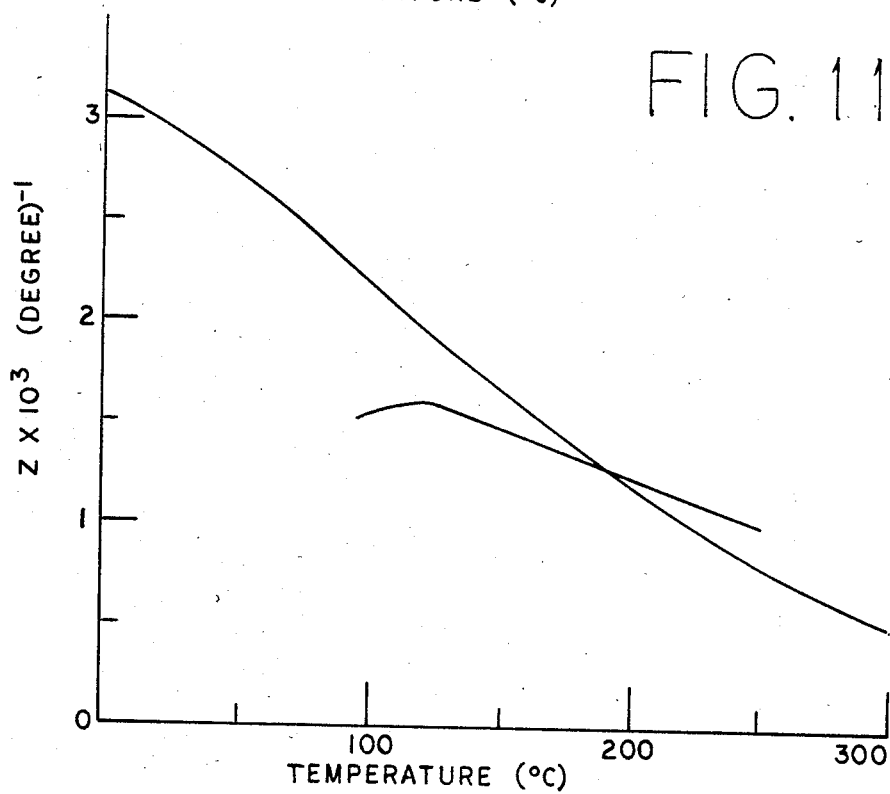
FIG. 11 is a graph illustrating the figure of merit (Z) versus temperature for a p-type alloy material of the present invention made in accordance with the first preferred embodiment of the method of the present invention and a conventional p-type grown polycrystalline material.
Figure 12:
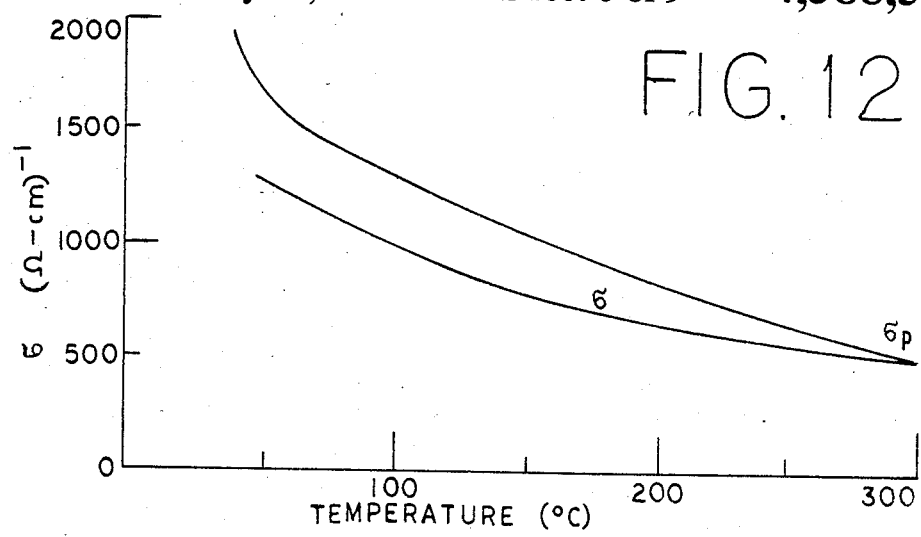
FIG. 12 is a graph illustrating the electrical conductivity ($\sigma$) versus temperature for the materials of FIG. 11.

FIGS. 11 and 12 illustrate the figure of merit (Z) and electrical conductivity ($\sigma$) respectively versus temperature for the above described p-type material of the invention and a conventional grown polycrystalline p-type material having the composition of Bi$_{10}$Sb$_{30}$Te$_{60}$. FIG. 11 reveals that like the n-type material of the invention, the figure of merit of the material of Example 15 is greater than the figure of merit of the conventional polycrystalline material above about 200° C. FIG. 12 reveals that the electrical conductivity of the material of the present invention, even though formed from pressed powder, was greater than the electrical conductivity of the conventional material over the entire displayed temperature range.

EXAMPLES 16-18

The n-type materials of Examples 16-18 have the general composition of:

(0.1 w/oTeI$_4$ doped Bi$_{40}$Te$_{60-x}$Se$_x$)$_{0.99}$+(Ag$_{25}$Sb$_{25}$Te$_{50}$)$_{0.01}$ where x equals 6, 12, and 18 respectively.

These materials were prepared in accordance with a second preferred embodiment of the present invention. Here, the constituent elements of the first compound (0.1 w/oTeI$_4$ doped Bi$_{40}$Te$_{60-x}$Se$_x$) were individually added to the already prepared second compound (Ag$_{25}$Sb$_{25}$Te$_{50}$) and melted at 800° C. After the melt cooled, the material was crushed and ground to form a particulate mixture. The powder was then loaded into a die and pressed under about 15 tons per square centimeter of pressure. The compacted bodies or elements of material were then sintered at about 400° C. for about two hours. As can be noted from the foregoing, this second embodiment of the present invention eliminates the need to pre-synthesize the first compound. The figure of merit and electrical conductivity versus temperature for these three materials are illustrated in FIGS. 13 and 14 respectively.

Figure 13:
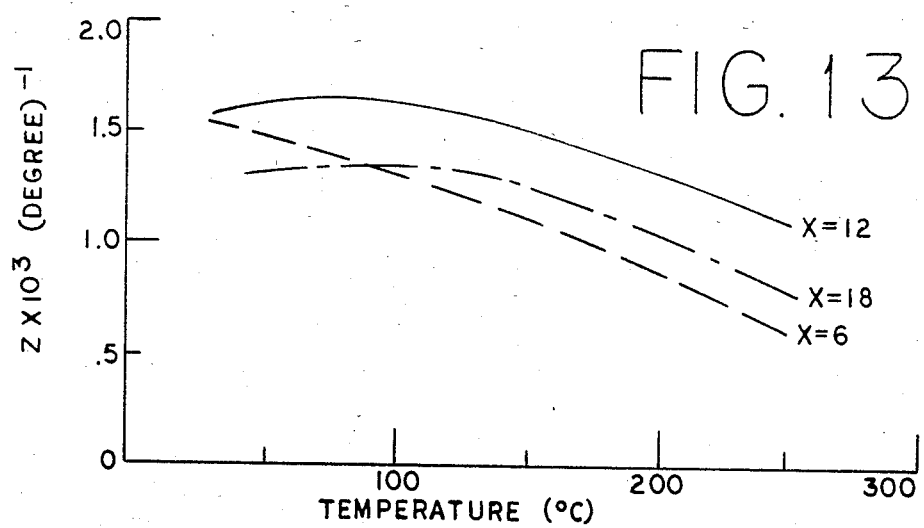
FIG. 13 is a graph illustrating the figure of merit (Z) versus temperature for various n-type alloy materials made in accordance with a second preferred embodiment of the method of the present invention.
Figure 14:
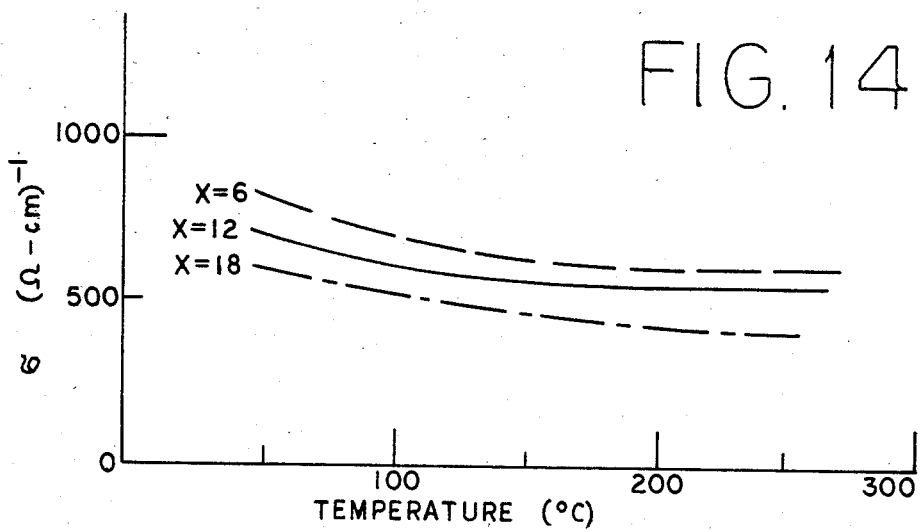
FIG. 14 is a graph illustrating the electrical conductivity ($\sigma$) versus temperature for the alloy materials of FIG. 13.

It can be noted from FIG. 13 that the material having about twelve percent (12%) selenium exhibits the best figure of merit over the temperature range displayed. The materials having six percent (6%) and eighteen percent (18%) selenium also have respectable figures of merit. FIG. 14 reveals that as the selenium content is increased, the electrical conductivity decreases. Although not illustrated in FIG. 13, the material having about 12% selenium has a better figure of merit than the conventional grown n-type polycrystalline material previously referred to at temperatures above about 190° C.

EXAMPLE 19

The material of this Example 19 has the composition of $(Bi_{10}Sb_{30}Te_{60})_{0.995} + (Ag_{25}Sb_{25}Te_{50})_{0.005}$ and is p-type. It was prepared in accordance with a third embodiment of the present invention wherein the first compound $(Bi_{10}Sb_{30}Te_{60})$ and second compound $(Ag_{25}Sb_{25}Te_{50})$ were separately prepared by forming a melt from their respective constituent elements in the proportions indicated. Thereafter, the compounds were separately crushed and ground. The powders were then mixed in the proportions of 99.5% of the first compound and 0.5% of the second compound to form a particulate mixture. The powder mixture was then pressed or compacted into solid bodies or elements under a pressure of 12 tons per square centimeter.

Figure 15:
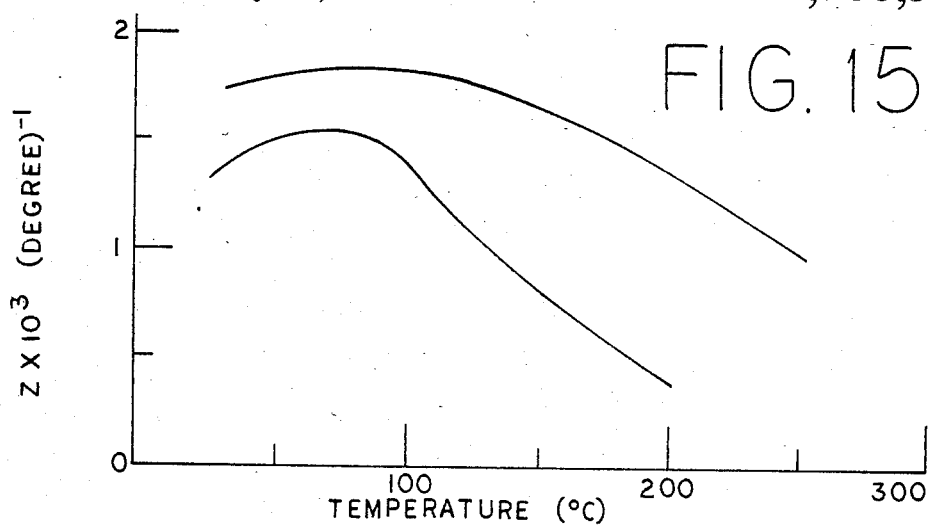
FIG. 15 is a graph illustrating the figure of merit (Z) versus temperature for a p-type alloy material of the present invention made in accordance with a further embodiment of the present invention and a p-type material formed from the powder pressing of a conventional grown polycrystalline material.
Figure 16:
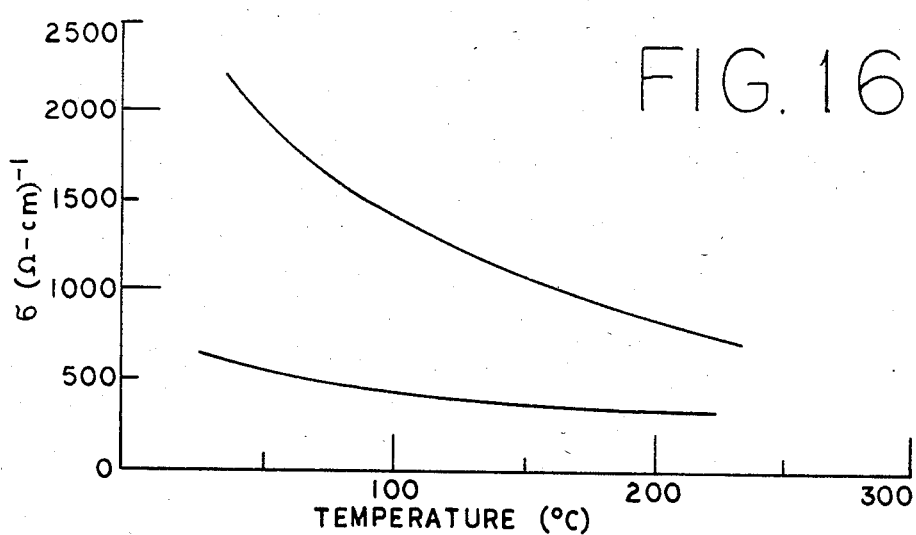
FIG. 16 is a graph illustrating the electrical conductivity ($\sigma$) versus temperature for the materials of FIG. 15.

FIG. 15 illustrates the figure of merit (Z) versus temperature for this material of the present invention and for the conventional p-type material which was also crushed and pressed. As can be noted, the alloy material of the present invention exhibits a greater figure of merit than the pressed conventional material. Although the material of this embodiment is not believed to incorporate all of the disorder of the materials of the previous examples, it is postulated that during pressing, plastic flow occurs leaving highly electrically conducting silver-tellurium phases in the interfaces between the compacted particles. FIG. 16 illustrates how the electrical conductivity is increased by practicing the method of this embodiment of the present invention. In FIG. 16 it can be noted that the electrical conductivity of the alloy material of the present invention is significantly greater than the electrical conductivity of the non-alloy conventional material.

EXAMPLES 20-23

The p-type materials of these Examples 20-23 have the general composition of:

(0.15 w/o $TeI_4$ doped $Bi_{10}Sb_{30}Te_{60})_{1-x} + (Ag_{25}Sb_{2.5}Te_{50})_x$ where x equals 0.4, 0.5, 0.6, and 1.

These materials were prepared in accordance with the third embodiment of the present invention as described with respect to Example 19. After being pressed at 6 tons per square centimeter, the materials were sintered at 400° C. in an argon atmosphere for about one hour.

Figure 17:
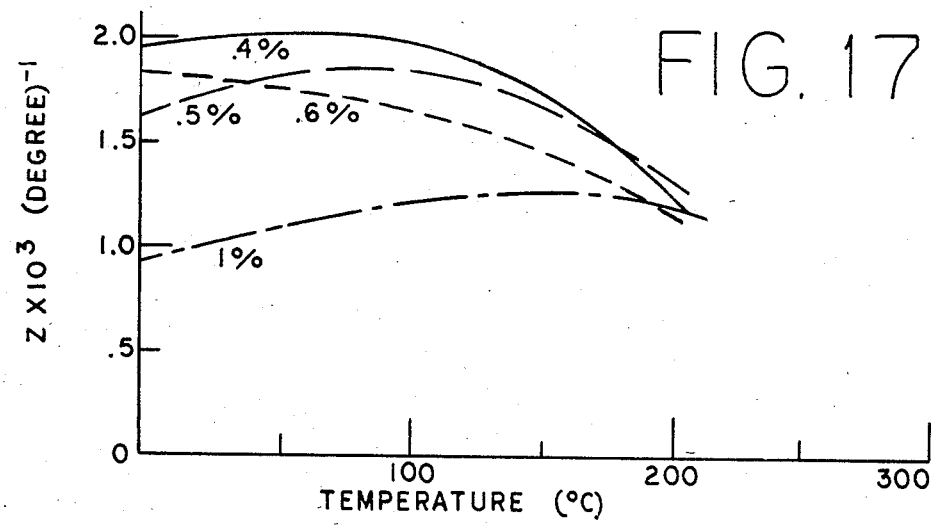
FIG. 17 is a graph illustrating the figure of merit (Z) versus temperature for various alloy materials of the present invention made in accordance with the further embodiment of the method of the present invention.

FIG. 17 illustrates the figure of merit (Z) versus temperature for these materials. As can be noted, the material having the 0.5% of the second compound $(Ag_{25}Sb_{2.65}Te_{50})$ exhibited the best overall figure of merit. Both that material and the material having 0.4% of the second compound exhibit a greater figure of merit than the previously mentioned conventional p-type grown polycrystalline material above about 130° C.

EXAMPLE 24

Figure 18:
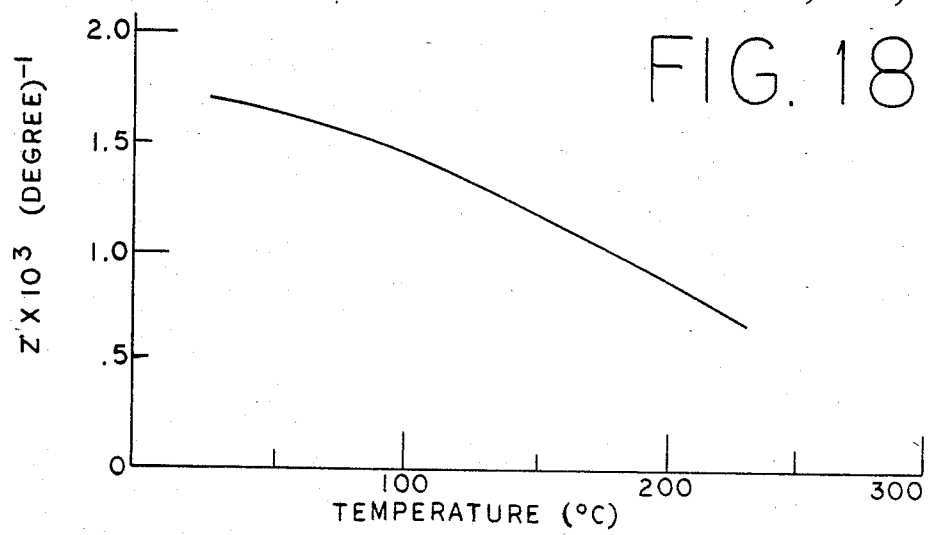
FIG. 18 is a graph illustrating the figure of merit (Z) versus temperature for an n-type alloy material of the present invention made in accordance with the further embodiment of the method of the present invention.
Figure 19:
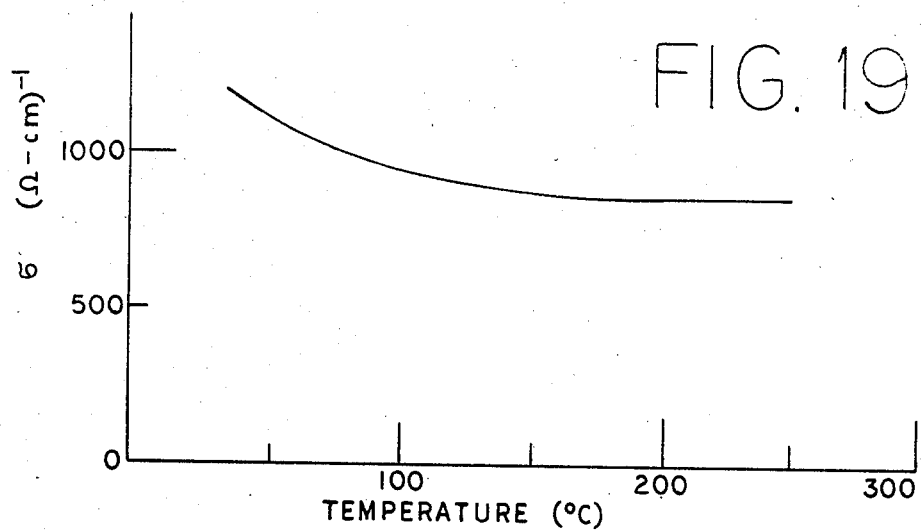
FIG. 19 is a graph illustrating the electrical conductivity ($\sigma$) versus temperature for the alloy material of FIG. 18.

The n-type material of this Example 24 has the composition of:

(0.1 w/o $CdCl_2$ doped $Bi_{40}Te_{54}Se_6)_{0.99} + (Ag_{25}Sb_{2.5}Te_{50})_{0.01}$. It was prepared in accordance with the third embodiment of the present invention as described with respect to Example 19. After being pressed at about 15 tons per square centimeter, the compacted bodies or elements were sintered at about 400° C. for about 2 hours. FIGS. 18 and 19 illustrate the figure of merit (Z) and electrical conductivity ($\sigma$) respectively versus temperature for this material. Some of the elements formed from this material were sintered at 400° C. for twenty hours. No significant difference in the figure of merit or electrical conductivity was noted.

EXAMPLES 25 AND 26

Figure 20:
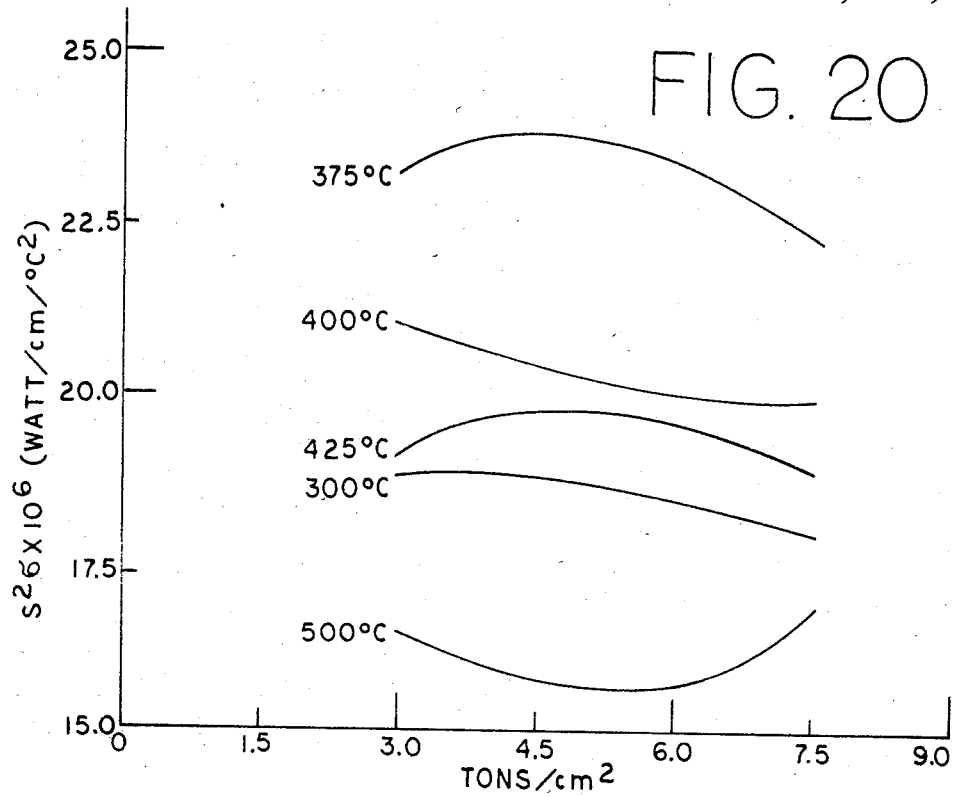
FIG. 20 is a graph illustrating the $S^2\sigma$ product for p-type alloys of the present invention prepared at various pressing pressures and sintered at indicated temperatures wherein the alloys were made in accordance with the second preferred embodiment of the method of the present invention.
Figure 21:
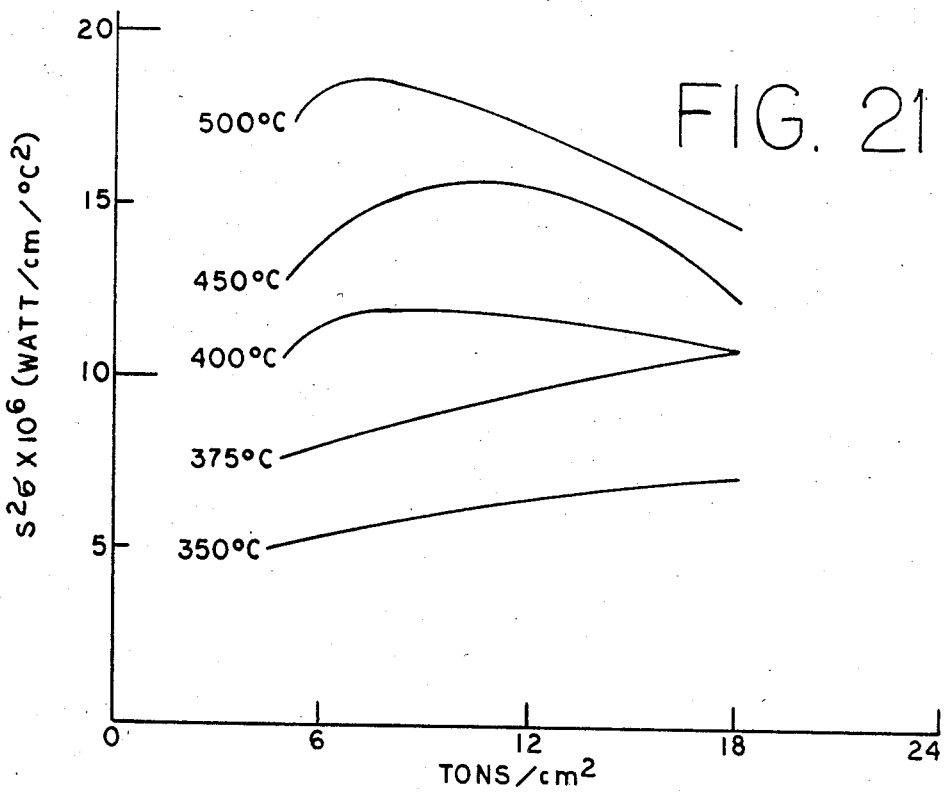
FIG. 21 is also a graph illustrating the $S^2\sigma$ product for n-type alloys of the present invention prepared at various pressing pressures and sintered at indicated temperatures wherein the alloys were made in accordance with the second preferred embodiment of the method of the present invention.

Examples 25 and 26 illustrate how the pressing pressures and sintering temperature can be varied to obtain optimized $S^2\sigma$ products for the alloys. FIGS. 20 and 21 graphically illustrate the effects of these parameters on the $S^2\sigma$ products of p-type and n-type alloys.

The data illustrated in FIGS. 20 and 21 resulted from measurements taken parallel to the direction in which the materials were pressed. The data previously presented in Examples 1 through 24 resulted from measurements taken perpendicular to the direction in which the materials were pressed.

The materials of Example 25 are p-type materials having the general composition of:

(0.2 w/o $TeI_4$ doped $Bi_{10}Te_{60}Sb_{30})_{0.99} + (Ag_{25}Sb_{2.5}Te_{50})_{0.01}$.

These materials were prepared in accordance with the second preferred embodiment of the instant invention. To that end, a melt was first formed at about 850° C. from the second compound $(Ag_{25}Sb_{25}Te_{50})$ and the constituent elements of the first compound in the indicated proportions. Thereafter, the melt was cooled to solid material form and crushed to form the particulate mixture. The particulate mixture, or powder, was then sifted through a 100 mesh screen to provide a particulate mixture having particles not greater than 150 microns in dimension. Respective portions of the particulate material were then pressed at different pressures to form respective compacted bodies. Lastly, the compacted bodies were sintered at 300, 375, 400, 425 or 500 degrees centigrade to complete the processing of the elements.

FIG. 20 illustrates the $S^2\sigma$ product of these elements to which this embodiment of the invention is directed as a function of pressing pressure and sintering temperature.

As can be noted, the $S^2\sigma$ product is maximized for this particular composition at pressing pressures in the range of approximately 3.3 tons/cm² to 6.6 tons/cm² and sintering temperatures at about 375° C.

The materials of Example 26 are n-type materials having the general composition of:

(0.2 w/o $TiI_4$ doped $Bi_{40}Te_{48}Se_{12})_{0.99} + (Ag_{25}Sb_{2.5}Te_{50})_{0.01}$.

This material was also prepared in accordance with the second preferred embodiment as described above with respect to Example 25. From FIG. 21, it can be seen that the $S^2\sigma$ product for this composition is maximized at pressing pressures in the range of 5.5 to 8.8 tons/cm$^2$ and sintering temperatures of about 500° C.

Modifications and variations of the present invention are possible in light of the above teachings. It is therefore, to be understood that within the scope of the appended claims the invention may be practiced otherwise than as specifically described.

What is claimed and described to be secured by Letters Patent of the United States is:

1. A compacted powder material body for thermoelectric applications, said material comprising bismuth, tellurium, and tellurium, at least one highly conductive phase consisting essentially of silver and tellurium, and tellurium iodide dopant, said material containing about 10 atomic percent bismuth, about 30 atomic percent antimony, about 60 atomic percent tellurium, up to 1.0 atomic percent silver, and up to about 0.15 atomic percent tellurium iodide.

2. A compacted powder material body for thermoelectric applications, said material comprising bismuth, tellurium, and selenium, at least one highly conductive phase consisting essentially of silver and tellurium, and cadmium chloride dopant, said material containing about 40 atomic percent bismuth, about 42 to 54 atomic percent tellurium, and 18 to 6 atomic percent selenium, up to 1.0 atomic percent silver, and up to about 0.15 atomic percent cadmium chloride.

3. A material as defined in claim 2 wherein said body further includes antimony in an amount up to 1 atomic percent.

4. A compacted powder material body for thermoelectric applications, said material comprising bismuth, tellurium, and selenium, at least one highly conductive phase consisting essentially of silver and tellurium, and tellurium iodide depant, said material containing about 40 atomic percent bismuth, about 42 to 54 atomic percent tellurium, and 18 to 6 atomic percent selenium, up to 1.0 atomic percent silver, and up to about 0.15 atomic percent tellurium iodide.

5. A material as defined in claim 4 wherein said body further includes antimony in an amount up to 1 atomic percent.

* * * * *